US006919213B2

(12) United States Patent
Flatté et al.

(10) Patent No.: US 6,919,213 B2
(45) Date of Patent: Jul. 19, 2005

(54) METHODS FOR OPERATING A UNIPOLAR SPIN TRANSISTOR AND APPLICATIONS OF SAME

(75) Inventors: Michael Edward Flatté, Iowa City, IA (US); Giovanni Vignale, Columbia, MO (US)

(73) Assignees: University of Missouri, Columbia, MO (US); University of Iowa Research Foundation, Iowa City, IA (US)

( * ) Notice: Subject to any disclaimer, the term of this patent is extended or adjusted under 35 U.S.C. 154(b) by 0 days.

(21) Appl. No.: 10/768,630

(22) Filed: Jan. 30, 2004

(65) Prior Publication Data

US 2004/0183151 A1 Sep. 23, 2004

Related U.S. Application Data

(60) Continuation of application No. 10/455,766, filed on Jun. 4, 2003, now Pat. No. 6,696,737, which is a division of application No. 10/014,925, filed on Oct. 26, 2001, now Pat. No. 6,624,490
(60) Provisional application No. 60/243,493, filed on Oct. 26, 2000.

(51) Int. Cl.[7] .................. H01L 21/00; H01L 21/331; H01L 21/8222
(52) U.S. Cl. ................. 438/3; 438/48; 438/309
(58) Field of Search ............. 438/3, 48, 309; 257/295, 420–425

(56) References Cited

U.S. PATENT DOCUMENTS

| 3,818,328 | A | 6/1974 | Zinn |
| 5,206,590 | A | 4/1993 | Dieny et al. |
| 5,432,373 | A | 7/1995 | Johnson |
| 5,541,868 | A | 7/1996 | Prinz |
| 5,629,549 | A | 5/1997 | Johnson |
| 5,654,566 | A | 8/1997 | Johnson |
| 5,721,654 | A | 2/1998 | Manako et al. |
| 5,793,697 | A | 8/1998 | Scheuerlein |
| 5,872,368 | A | 2/1999 | Osofsky et al. |
| 5,929,636 | A | 7/1999 | Torok et al. |
| 6,031,273 | A | 2/2000 | Torok et al. |
| 6,064,083 | A | 5/2000 | Johnson |
| 6,114,719 | A | 9/2000 | Dill et al. |
| 6,297,987 | B1 | 10/2001 | Johnson et al. |

FOREIGN PATENT DOCUMENTS

WO   WO 97/41606   11/1997

OTHER PUBLICATIONS

Baibich et al. "Giant Magnetoresistance of (001)Fe/(001) Cr Magnetic Superlattices," *Phys. Rev. Lett.*, 61(21):2472–2475 (Nov. 1988).
Datta and Das. "Electronic analog of the electro–optic modulator," *Appl. Phys. Lett.*, 56(7):665–667 (Feb. 1990).
Daughton et al. "Magnetic field Sensors Using GMR Multilayer," *IEEE Trans. Magn.*, 30(6):4608–4610 (Nov. 1994).

(Continued)

Primary Examiner—Cuong Nguyen
(74) Attorney, Agent, or Firm—Needle & Rosenberg, PC

(57) ABSTRACT

A unipolar spin transistor includes a semiconductor material having a first region, a second region, and a third region. The first region is adjacent to the second region so as to form a first domain between the first region and the second region, and the second region is adjacent to the third region so as to form a second domain between the second region and the third region. A first voltage is provided between the first region and the second region to cause carriers to move across the first domain from the first region to the second region. A second voltage is generated between the second region and the third region to cause the carriers move across the second domain from the second region to the third region. The second voltage has an amplitude different from that of the first voltage. The first region and the third region have a first spin polarization, and the second region has a second spin polarization which may be different from the first spin polarization.

18 Claims, 7 Drawing Sheets

OTHER PUBLICATIONS

Egues. "Spin–Dependent Perpendicular Magnetotransport through a Tunable ZnSe/Zn1–xMnxSe Heterostructure: A Possible Spin Filter?," *Phys. Rev. Lett.* 80(20):4578–4581 (May 1998).

Fert and Lee. "Theory of the bipolar spin switch,". *Phys. Rev. B*, 53:6654–6565 (Mar. 1996).

Flatte and Byers. "Spin Diffusion in Semiconductors," *Phys. Rev. Lett.*, 84(18):4220–4223 (May 2000).

Flatte and Vignale. "Unipolar spin diodes and transistors," *Appl. Phys. Lett.*, 78(9):1273–1275 (Feb. 2001).

Gou et al. "Resonance splitting effect and wave–vector filtering effect in magnetic superlattices," *J. Appl. Phys.* 83(8):4545–4547 (Apr. 1998).

Johnson. "Spin polarization of gold films via transported (invited)," *J. Appl. Phys.*, 75(10):6714–6719 (May 1994).

Johnson. "Spin Accumulation in Gold Films," *Phys. Rev. Lett.*, 70(14):2142–2145 (Apr. 1993).

Kikkawa et al. "Room–Temperature Spin Memory in Two–Dimensional Electron Gases," *Science*, 277:1284–1287 (Aug. 1997).

Konig et al. "Magneto–optical properties of $Zn_{0.95}Mn_{0.05}Se/Zn_{0.76}Be_{0.08}Mg_{0.16}Se$ quantum wells and $Zn_{0.91}Mn_{0.09}Se/Zn_{.0972}Be_{0.028}Se$ spin superlattices," *Phys. Rev. B*, 60(4):2653–2660 (Jul. 1999).

Moodera et al. "Large Magnetoresistence at Room Temperature in Ferromagnetic Thin Film Tunnel Junctions," *Phys. Rev. Lett.*, 74(16):3273–3276 (Apr. 1995).

Ohno et al. "Spin Relaxation in GaAs(110) Quantum Wells." *Phys. Rev. Lett.*, 83(20):4196–4199 (Nov. 1999).

Ohno et al. "Spontaneous splitting of ferromagnetic (Ga, Mn) As valence band observed by resonant tunneling spectroscopy," *Appl. Phys. Lett.*, 73(3):363–365 (Jul. 1998).

Ohno et al. "Electrical spin injection in a ferromagnetic semiconductor heterostructure." *Nature (London)*, 402:790–792 (Dec. 1999).

Ohno. "Making Nonmagnetic Semiconductors Ferromagnetic," *Science*, 281:951–956 (Aug. 1998).

Prinz. "Magnetoelectronics," *Science*, 282:1660–1663 (Nov. 1998).

Prinz. "Magnetoelectronics," *Science*, 283:330 (Jan. 1999).

Sze. "Bipolar Transistor," in *Physics of Semiconductor Devices*, 2nd ed. (John Wiley Sons, New York) chapter 3, pp. 144–184 (1981).

METHODS FOR OPERATING A UNIPOLAR SPIN TRANSISTOR AND APPLICATIONS OF SAME

CROSS-REFERENCE TO RELATED PATENT APPLICATIONS

This application is a continuation of U.S. patent application Ser. No. 10/455,766, filed Jun. 4, 2003, now U.S. Pat. No. 6,696,737,which is a divisional of U.S. patent application Ser. No. 10/014,925, which was filed Oct. 26, 2001, now U.S. Pat. No. 6,624,490, claiming the benefit, pursuant to 35 U.S.C. §119(e), of provisional U.S. Patent Application No. 60/243,493, filed Oct. 26, 2000. These applications are hereby incorporated by reference in their entireties.

STATEMENT REGARDING FEDERALLY SPONSORED RESEARCH OR DEVELOPMENT

This invention was made with government support under NSF Grant ECS-0000556. The government may have certain rights in the invention.

BACKGROUND OF THE INVENTION

1. Field of the Invention

The present invention generally relates to a transistor. More particularly, the present invention relates to a unipolar spin transistor through a mechanism based on inhomogeneous spin polarization.

2. Description of the Related Art

Most semiconductor devices are based on the p-n diode or the transistor. A large class of transistors are the so-called bipolar transistors consisting of back to back p-n diodes either in a p-n-p or n-p-n arrangement. By controlling the chemical potential of the middle region (called the base) the collector current ($I_C$) can be varied, and $I_C$ depends on the base voltage ($V_{EB}$) exponentially.

The development of transistors and its later evolution into the integrated circuit or microchip revolutionized people's daily life and the world. Continuous efforts have been made to find new types of diodes and transistors.

Until recently the emerging field of magneto electronics has focused on magnetic metals for conducting components [1] (hereinafter "[n]" referring to the nth reference in the attached list of references at the end of the specification). Multilayer magnetoelectronic devices, such as giant magnetoresistive ("GMB") [2,3] and magnetic tunnel junction (MTJ) [4–6] devices, have revolutionized magnetic sensor technology and hold promise for reprogrammable logic and nonvolatile memory applications. The performance of these devices improves as the spin polarization of the constituent material approaches 100%, and thus there are continuing efforts to find 100% spin-polarized conducting materials.

Doped magnetic semiconductors are a promising direction towards such materials, for the bandwidth of the occupied carrier states is narrow. For example, for nondegenerate carriers and a spin splitting of 100 meV the spin polarization will be 98% at room temperature. To date high-temperature ($T_{Curie}$>100K) ferromagnetic semiconductors such as $Ga_{1-x}Mn_xAs$ are effectively p-doped. Semi-magnetic n-doped semiconductors like BeMnZnSe, however, have already been shown to be almost, 100% polarized (in the case of BeMnZnSe in a 2T external field at 30K) [7]. Both resonant tunneling diodes (RTDs) [8] and light-emitting diodes (LEDs) [9] have been demonstrated which incorporate one layer of ferromagnetic semiconductor. It is inevitable that devices incorporating multiple layers of ferromagnetic semiconducting material will be constructed. Note that "ferromagnetic semiconducting material" or "ferromagnetic semiconductor" as used in this specification includes any magnetic and semi-magnetic semiconductors that is a semiconductor and has a spin polarization, which can be affected by or interact with a magnetic field.

Motivated by this possibility the inventors have investigated the transport properties of specific device geometries based on multilayers of spin-polarized unipolar doped semiconductors. Previous theoretical work in this area includes spin transport in homogeneous semiconductors [10, 11] and calculations of spin filtering effects in superlattices [12]. The inventors continued their effort to study the nonlinear transport properties, particularly the behavior of the charge current, of two and three-layer heterostructures, and in particular, developed a unipolar spin diode and transistor through a mechanism based on inhomogeneous spin polarization.

SUMMARY OF THE INVENTION

In one aspect, the present invention provides a unipolar spin diode. In one embodiment of the present invention, the unipolar spin diode includes a first semiconductor region having a conductivity type and a spin polarization, and a second semiconductor region having a conductivity type that is same to the conductivity type of the first semiconductor and a spin polarization that is different from the spin polarization of the first semiconductor region. The first semiconductor region and the second semiconductor region are adjacent to each other so as to form a spin depletion layer therebetween, the spin depletion layer having a first side and an opposing second side. When a majority carrier in the first semiconductor region moves across the spin depletion layer from the first side of the spin depletion layer to the second side of the spin depletion layer, the majority carrier in the first semiconductor region becomes a minority carrier in the second semiconductor region. Moreover, when a majority carrier in the second semiconductor region moves across the spin depletion layer from the second side of the spin depletion layer moves to the first side of the spin depletion layer, the majority carrier in the second semiconductor region becomes a minority carrier in the first semiconductor region.

In one embodiment of the present invention, each of the first semiconductor region and the second semiconductor region comprises a p-type semiconductor layer, wherein the p-type semiconductor layer of the first semiconductor region is ferromagnetic, and the spin polarization of the first semiconductor region is either up or down. Moreover, the p-type semiconductor layer of the second semiconductor region is ferromagnetic, and the spin polarization of the second semiconductor region is either up if the spin polarization of the first semiconductor region is down, or down if the spin polarization of the first semiconductor region is up.

The majority carrier in the first semiconductor region can be a positive hole having a spin up, and the minority carrier in the first semiconductor region can be a positive hole having a spin down. Correspondingly, the majority carrier in the second semiconductor region is a positive hole having a spin down, and the minority carrier in the second semiconductor region is a positive hole having a spin up.

The majority carrier in the first semiconductor region can also be a positive hole having a spin down, and the minority carrier in the first semiconductor region is a positive hole having a spin up. Correspondingly, the majority carrier in the second semiconductor region is a positive hole having a spin up, and the minority carrier in the second semiconductor region is a positive hole having a spin down.

In other embodiment of the present invention, each of the first semiconductor region and the second semiconductor region comprises a n-type semiconductor layer, wherein the n-type semiconductor layer of the first semiconductor region is ferromagnetic, and the spin polarization of the first semiconductor region is either up or down. Moreover, the n-type semiconductor layer of the second semiconductor region is ferromagnetic, and the spin polarization of the second semiconductor region is either up if the spin polarization of the first semiconductor region is down, or down if the spin polarization of the first semiconductor region is up.

The majority carrier in the first semiconductor region can be an electron having a spin up, and the minority carrier in the first semiconductor region is an electron having a spin down. Correspondingly, the majority carrier in the second semiconductor region is an electron having a spin down, and the minority carrier in the second semiconductor region is an electron having a spin up.

The majority carrier in the first semiconductor region can also be an electron having a spin down, and the minority carrier in the first semiconductor region is an electron having a spin up. Correspondingly, the majority carrier in the second semiconductor region is an electron having a spin up, and the minority carrier in the second semiconductor region is an electron having a spin down.

The spin deletion layer may be characterized as one of a Neel wall and a Block wall, wherein the thickness of the spin deletion layer is at least partially determined by the ratio between the magnetic anisotropy energy and the magnetic stiffness of the first semiconductor region and the second semiconductor region.

Furthermore, the diode has a substrate of either an insulating material or a semi-insulating material, wherein the substrate supports the first semiconductor region and the second semiconductor region.

In another aspect, the present invention provides a unipolar spin diode. In one embodiment of the present invention, the unipolar spin diode includes a first semiconductor region having a spin polarization characterized by a first orientation, and a second semiconductor region having a spin polarization characterized by a second orientation opposite to the first orientation of the spin polarization of the first semiconductor region. The first semiconductor region and the second semiconductor region are adjacent to each other so as to form a domain wall therebetween, wherein the domain wall has a first side and an opposing second side.

When a majority carrier in the first semiconductor region moves across the domain wall to the second semiconductor region, the majority carrier in the first semiconductor region becomes a minority carrier in the second semiconductor region. Moreover, when a majority carrier in the second semiconductor region moves across the domain wall to the first semiconductor region, the majority carrier in the second semiconductor region becomes a minority carrier in the first semiconductor region. Furthermore, majority carriers in the first semiconductor region and the second semiconductor region have the same charge polarity.

In a further aspect, the present invention provides a unipolar spin transistor. In one embodiment of the present invention, the unipolar spin transistor includes a first semiconductor region having a conductivity type and a first spin polarization, a second semiconductor region having a conductivity type that is the same conductivity type of the first semiconductor region and a second spin polarization that is different from the first spin polarization of the first semiconductor region, and a third semiconductor region having a conductivity type that is the same conductivity type of the first semiconductor region and the first spin polarization. The first semiconductor region and the second semiconductor region are adjacent to each other so as to form a first spin depletion layer therebetween, the first spin depletion layer having a first side facing the first semiconductor region and an opposing second side facing the second semiconductor region. Additionally, the second semiconductor region and the third semiconductor region are adjacent to each other so as to form a second spin depletion layer therebetween, the second spin depletion layer having a first side facing the second semiconductor region and an opposing second side facing the third semiconductor region.

When a majority carrier in the first semiconductor region moves across the first spin depletion layer from the first side of the first spin depletion layer to the second side of the first spin depletion layer, the majority carrier in the first semiconductor region becomes a minority carrier in the second semiconductor region, and when the minority carrier in the second semiconductor region moves across the second spin depletion layer from the first side of the second spin depletion layer to the second side of the second spin depletion layer, the minority carrier in the second semiconductor region becomes a majority carrier in the third semiconductor region.

Likewise, when a majority carrier in the third semiconductor region moves across the second spin depletion layer from the second side of the second spin depletion layer to the first side of the second spin depletion layer, the majority carrier in the third semiconductor region becomes a minority carrier in the second semiconductor region, and when the minority carrier in the second semiconductor region moves across the first spin depletion layer from the second side of the first spin depletion layer to the first side of the first spin depletion layer, the minority carrier in the second semiconductor region becomes a majority carrier in the first semiconductor region.

In one embodiment of the present invention, each of the first semiconductor region, the second semiconductor region and the third semiconductor region comprises a p-type semiconductor layer. The p-type semiconductor layer of the second semiconductor region is ferromagnetic, and the spin polarization of the second semiconductor region is either up or down. Moreover, the p-type semiconductor layer of the first semiconductor region and the p-type semiconductor layer of the third semiconductor region are ferromagnetic, and the spin polarization of the first semiconductor region and the spin polarization of the third semiconductor region are either up if the spin polarization of the second semiconductor region is down, or down if the spin polarization of the second semiconductor region is up.

In another embodiment of the present invention, each of the first semiconductor region, the second semiconductor region and the third semiconductor region comprises a n-type semiconductor layer. The n-type semiconductor layer of the second semiconductor region is ferromagnetic, and the spin polarization of the second semiconductor region is either up or down. Moreover, the n-type semiconductor layer of the first semiconductor region and the n-type semiconductor layer of the third semiconductor region are ferromagnetic, and the spin polarization of the first semiconductor region and the spin polarization of the third semiconductor region are either up if the spin polarization of the second semiconductor region is down, or down if the spin polarization of the second semiconductor region is up.

Each of the first spin deletion layer and the second spin deletion layer may be characterized as one of a Neel wall and a Block wall, wherein the thickness of each of the first spin deletion layer and the second spin deletion layer is at least partially determined by the ratio between the magnetic anisotropy energy and the magnetic stiffness of the first semiconductor region and the second semiconductor region, and the second semiconductor region and the third semiconductor region, respectively.

The transistor further includes a substrate of either an insulating material or a semi-insulating material, wherein the substrate supports the first semiconductor region, the second semiconductor region and the third semiconductor region.

In yet another aspect, the present invention provides a method of changing amplitude of electric signals. In one embodiment of the present invention, the method includes the steps of providing a semiconductor material having a first region, a second region, and a third region, wherein the first region is adjacent to the second region so as to form a first domain between the first region and the second region, and the second region is adjacent to the third region so as to form a second domain between the second region and the third region, providing a first voltage between the first region and the second region to cause carriers to move across the first domain from the first region to the second region, and generating a second voltage between the second region and the third region to cause the carriers move across the second domain from the second region to the third region and the second voltage has an amplitude different from that of the first voltage. The first region and the third region have a first spin polarization and the second region has a second spin polarization different from the first spin polarization. Moreover, the carriers in each of the first, second and third regions have same charge polarity.

The first spin polarization can be up and correspondingly, the second spin polarization is down. The first spin polarization can be down and correspondingly, the second spin polarization is up. The carriers can be electrons or holes.

In a further aspect, the present invention provides an apparatus of changing amplitude of electric signals. In one embodiment of the present invention, the apparatus includes a semiconductor material having a first region, a second region, and a third region, wherein the first region is adjacent to the second region so as to form a first domain between the first region and the second region, and the second region is adjacent to the third region so as to form a second domain between the second region and the third region. The apparatus further has means for providing a first voltage between the first region and the second region to cause carriers to move across the first domain from the first region to the second region, and means for generating a second voltage between the second region and the third region to cause the carriers move across the second domain from the second region to the third region and the second voltage has an amplitude different from that of the first voltage, wherein the first region and the third region has a first spin polarization and the second region has a second spin polarization different from the first spin polarization, and the carriers in each of the first, second and third regions has same charge polarity.

In another aspect, the present invention provides a memory cell having a unipolar spin transistor for nonvolatile memory applications for storing a data state corresponding to one of a first and a second logical data values. In one embodiment of the present invention, the memory cell includes a magnetic semiconductor material having a first region, a second region, and a third region, wherein the first region is adjacent to the second region so as to form a first domain between the first region and the second region, and the second region is adjacent to the third region so as to form a second domain between the second region and the third region. Moreover, the first region and the third region has a first spin polarization and the second region has a second spin polarization, each of the first spin polarization and the second spin polarization can be up or down.

The ferromagnetic semiconductor material is in a high-resistance state when the second spin polarization of the second region is opposite to the first spin polarization of the first and third regions, and the ferromagnetic semiconductor material is in a low-resistance state when the second spin polarization of the second region is aligned to the first spin polarization of the first and third regions. The memory cell stores the first logical value when the ferromagnetic semiconductor material is in the high-resistance state, and the memory cell stores the second logical value when the ferromagnetic semiconductor material is in the low-resistance state. The memory is retained until a different state is stored in the cell.

The orientation of the second spin polarization can be altered by an external magnetic field to become one of aligned and opposite to the orientation of the first spin polarization. In one embodiment, the first region comprises an emitter of the unipolar spin transistor, the second region comprises a base of the unipolar spin transistor and the third region comprises a collector of the unipolar spin transistor. The magnetic semiconductor material can be chosen from a variety of magnetic materials such as GaMnAs, TiCoO2, BeMnZnSe and the like.

In yet another aspect, the present invention provides a method of operating a unipolar spin transistor for nonvolatile memory applications for storing a data state corresponding to one of a first and a second logical data values, wherein the unipolar spin transistor includes a magnetic semiconductor material having a first region, a second region, and a third region, wherein the first region is adjacent to the second region so as to form a first domain between the first region and the second region, and the second region is adjacent to the third region so as to form a second domain between the second region and the third region, wherein the first region and the third region has a first spin polarization and the second region has a second spin polarization, each of the first spin polarization and the second spin polarization can be up or down, and wherein the ferromagnetic semiconductor material is in a high-resistance state when the second spin polarization of the second region is opposite to the first spin polarization of the first and third regions, and the ferromagnetic semiconductor material is in a low-resistance state when the second spin polarization of the second region is aligned to the first spin polarization of the first and third regions.

In one embodiment of the present invention, the method includes the steps of altering the orientation of the second spin polarization to become one of aligned and opposite to the orientation of the first spin polarization, and storing the first logical data value when the ferromagnetic semiconductor material is in the high-resistance state, and storing the second logical value when the ferromagnetic semiconductor material is in the low-resistance state.

In yet another aspect, the present invention provides a method of operating a unipolar spin transistor for detecting magnetic field, wherein the unipolar spin transistor includes a magnetic semiconductor material having a first region, a second region, and a third region, wherein the first region is adjacent to the second region so as to form a first domain between the first region and the second region, and the second region is adjacent to the third region so as to form a second domain between the second region and the third region, wherein the first region and the third region has a first spin polarization and the second region has a second spin polarization, each of the first spin polarization and the second spin polarization can be up or down, and wherein the ferromagnetic semiconductor material is in a high-resistance state when the second spin polarization of the second region is opposite to the first spin polarization of the first and third regions, and the ferromagnetic semiconductor material is in a low-resistance state when the second spin polarization of the second region is aligned to the first spin polarization of the first and third regions.

In one embodiment of the present invention, the method includes the steps of subjecting the second region to a test area, measuring the status of the ferromagnetic semiconductor material, and determining the presence of an external magnetic field, wherein the presence of an external magnetic field causes the status of the ferromagnetic semiconductor material to alter from one of the high-resistance state and the low-resistance state to another.

In another aspect, the present invention provides an apparatus of operating a unipolar spin transistor for detecting magnetic field, wherein the unipolar spin transistor includes a magnetic semiconductor material having a first region, a second region, and a third region, wherein the first region is adjacent to the second region so as to form a first domain between the first region and the second region, and the second region is adjacent to the third region so as to form a second domain between the second region and the third region, wherein the first region and the third region has a first spin polarization and the second region has a second spin polarization, each of the first spin polarization and the second spin polarization can be up or down, and wherein the ferromagnetic semiconductor material is in a high-resistance state when the second spin polarization of the second region is opposite to the first spin polarization of the first and third regions, and the ferromagnetic semiconductor material is in a low-resistance state when the second spin polarization of the second region is aligned to the first spin polarization of the first and third regions.

In one embodiment of the present invention, the apparatus has means for subjecting the second region to a test area, means for measuring the status of the ferromagnetic semiconductor material, and means for determining the presence of an external magnetic field, wherein the presence of an external magnetic field causes the status of the ferromagnetic semiconductor material to alter from one of the high-resistance state and the low-resistance state to another. The subjecting means can be a read head.

In a further aspect, the present invention provides a method of operating a unipolar spin transistor for detecting magnetic field, wherein the unipolar spin transistor includes a magnetic semiconductor material having a first region, a second region, and a third region, wherein the first region is adjacent to the second region so as to form a first domain between the first region and the second region, and the second region is adjacent to the third region so as to form a second domain between the second region and the third region, wherein the first region has a first spin polarization, the second region has a second spin polarization opposite to the first spin polarization, and the third region has a third spin polarization parallel to the first spin polarization, wherein a minority carrier in the second region is characterized by an energy band having a barrier height, and wherein the ferromagnetic semiconductor material has a resistance related to the barrier height. Each of the first region, the second region and the third region can comprise a p-type semiconductor layer or an n-type semiconductor layer.

In one embodiment of the present invention, the method includes the steps of subjecting the second region to a test area, measuring the resistance of the ferromagnetic semiconductor material, and determining the presence of an external magnetic field, wherein the presence of an external magnetic field causes the barrier height of the energy band of the minority carrier to change, and wherein the change of the barrier height of the energy band causes the resistance of the ferromagnetic semiconductor material to change from one value to another. Each of the first region, the second region and the third region can comprise a p-type semiconductor layer or an n-type semiconductor layer.

In another aspect, the present invention provides an apparatus of operating a unipolar spin transistor for detecting magnetic field, wherein the unipolar spin transistor includes a magnetic semiconductor material having a first region, a second region, and a third region, wherein the first region is adjacent to the second region so as to form a first domain between the first region and the second region, and the second region is adjacent to the third region so as to form a second domain between the second region and the third region, wherein the first region has a first spin polarization, the second region has a second spin polarization opposite to the first spin polarization, and the third region has a third spin polarization parallel to the first spin polarization, wherein a minority carrier in the second region is characterized by an energy band having a barrier height, and wherein the ferromagnetic semiconductor material has a resistance related to the barrier height.

In one embodiment of the present invention, the apparatus has means for subjecting the second region to a test area, means for measuring the resistance of the ferromagnetic semiconductor material, and means for determining the presence of an external magnetic field, wherein the presence of an external magnetic field causes the barrier height of the energy band of the minority carrier to change, and wherein the change of the barrier height of the energy band causes the resistance of the ferromagnetic semiconductor material to change from one value to another.

In yet another aspect, the present invention provides a method of operating a unipolar spin transistor in a reprogrammable logic process determined by a combination of input logic signals, wherein the unipolar spin transistor includes a magnetic semiconductor material having a first region, a second region, and a third region, wherein the first region is adjacent to the second region so as to form a first domain between the first region and the second region, and the second region is adjacent to the third region so as to form a second domain between the second region and the third region, wherein the first region and the third region has a first spin polarization and the second region has a second spin polarization, each of the first spin polarization and the second spin polarization can be up or down, wherein the ferromagnetic semiconductor material is in a first non-volatile state when the second spin polarization of the second region is opposite to the first spin polarization of the first and third regions, and the ferromagnetic semiconductor material is in a second non-volatile state when the second spin polarization of the second region is aligned to the first spin polarization of the first and third regions, and wherein each of the first and second non-volatile states represents a binary value.

In one embodiment of the present invention, the method includes the steps of subjecting the second region to a magnetic field to cause the state of the ferromagnetic semiconductor material to alter from one of the first and second non-volatile states to another, thereby generating a new binary value relating to a new input logic signal, and storing the new binary value relating to a new input logic signal so as to reprogram a logic process.

In a further aspect, the present invention provides an apparatus of operating a unipolar spin transistor in a reprogrammable logic process determined by a combination of input logic signals, wherein the unipolar spin transistor includes a magnetic semiconductor material having a first region, a second region, and a third region, wherein the first region is adjacent to the second region so as to form a first domain between the first region and the second region, and the second region is adjacent to the third region so as to form a second domain between the second region and the third region, wherein the first region and the third region has a first spin polarization and the second region has a second spin polarization, each of the first spin polarization and the second spin polarization can be up or down, wherein the ferromagnetic semiconductor material is in a first non-volatile state when the second spin polarization of the second region is opposite to the first spin polarization of the first and third regions, and the ferromagnetic semiconductor material is in a second non-volatile state when the second spin polarization of the second region is aligned to the first spin polarization of the first and third regions, and wherein each of the first and second non-volatile states represents a binary value.

In one embodiment of the present invention, the apparatus includes means for subjecting the second region to a magnetic field to cause the state of the ferromagnetic semiconductor material to alter from one of the first and second non-volatile states to another, thereby generating a new binary value relating to a new input logic signal, and means for storing the new binary value relating to a new input logic signal so as to reprogram a logic process.

These and other aspects will become apparent from the following description of the preferred embodiment taken in conjunction with the following drawings, although variations and modifications may be effected without departing from the spirit and scope of the novel concepts of the disclosure.

DETAILED DESCRIPTION OF THE INVENTION

Figure 1:
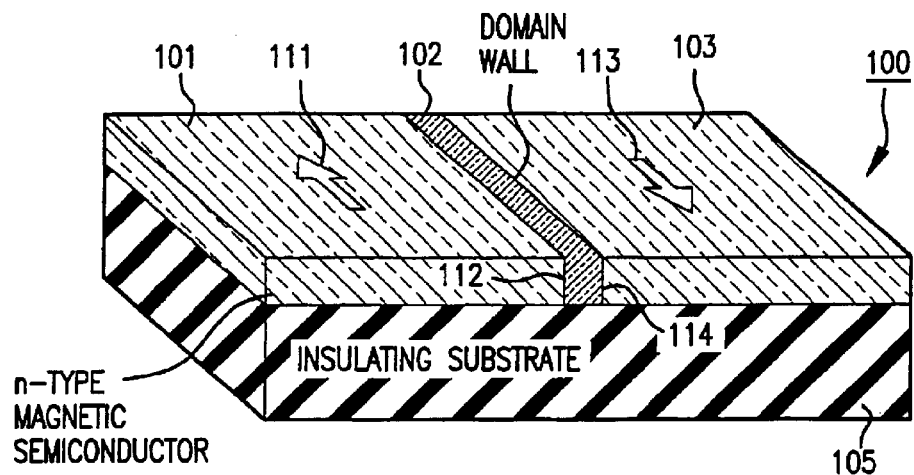
FIG. 1 is a perspective view of a unipolar spin diode in one embodiment of the present invention.

Several embodiments of the invention are now described in detail. Referring to the drawings, like numbers indicate like parts throughout the views. As used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise.

Overview of the Invention

Figure 2:
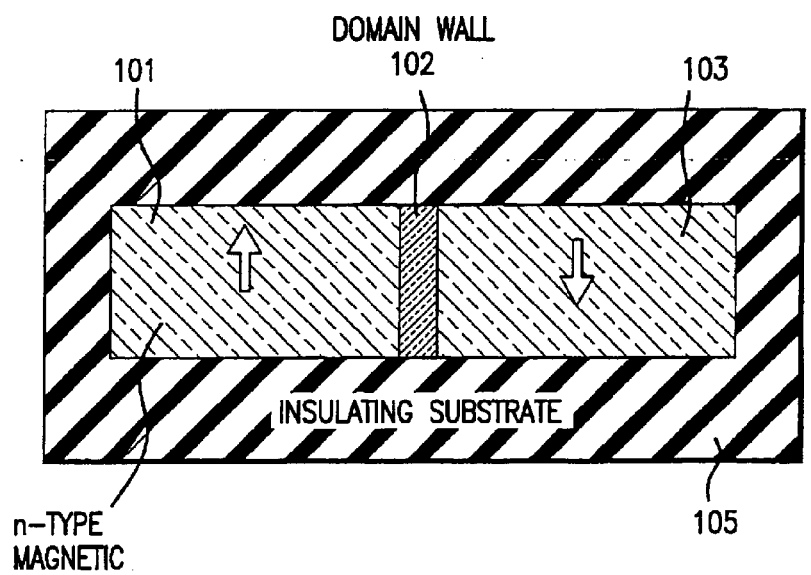
FIG. 2 is a top view of a unipolar spin diode of FIG. 1.

Referring generally to FIGS. 1–6 and in particular to FIGS. 1 and 2 now, in one aspect, the present invention provides a unipolar spin diode 100. In one aspect, the present invention provides a unipolar spin diode 100. In one embodiment of the present invention, the unipolar spin diode 100 includes a first semiconductor region 101 having a conductivity type and a spin polarization 111, and a second semiconductor region 103 having a conductivity type that is same to the conductivity type of the first semiconductor 101 and a spin polarization 113 that is different from the spin polarization 111 of the first semiconductor region 101. The first semiconductor region 101 and the second semiconductor region 103 are adjacent to each other so as to form a spin depletion layer 102 or domain therebetween. The spin depletion layer 102 has a first side 112 and an opposing second side 114. The spin depletion layer 102 can also be characterized as a domain wall between the first semiconductor region 101 and the second semiconductor region 103. Unlike in an ordinary p-n diode, where majority carriers on the two sides of the domain wall or p-n junction have opposite charge polarities, majority carriers in the first semiconductor region 101 and the second semiconductor region 103 have the same charge polarity but different spin orientation, which is the reason we call the diode of the present invention as "unipolar spin diode."0 When a majority carrier in the first semiconductor region 101 moves across the spin depletion layer 102 from the first side 112 of the spin depletion layer 102 to the second side 114 of the spin depletion layer 102, the majority carrier in the first semiconductor region 101 becomes a minority carrier in the second semiconductor region 103. Moreover, when a majority carrier in the second semiconductor region 103 moves across the spin depletion layer 102 from the second side 114 of the spin depletion layer 102 moves to the first side 112 of the spin depletion layer 102, the majority carrier in the second semiconductor region 103 becomes a minority carrier in the first semiconductor region 101.

Furthermore, the diode 100 has a substrate 105 that supports the first semiconductor region 101 and the second semiconductor region 103. The substrate is made from either an insulating material or a semi-insulating material.

As shown in FIGS. 1 and 2, each of the first semiconductor region 101 and the second semiconductor region 103 comprises a n-type semiconductor layer, wherein the n-type semiconductor layer of the first semiconductor region 101 is ferromagnetic. Because the first semiconductor region 101 is n-type semiconductor, electrons (negative charge) would carry the electric current in the first semiconductor region 101. The spin polarization 111 of the first semiconductor region 101 can be either up or down. Note that the up and down of a spin represent two distinctive states of the spin, no necessarily indicating a direction of the spin in a real space.

Moreover, the n-type semiconductor layer of the second semiconductor region 103 is the same as the n-type semiconductor layer of the first semiconductor region 101. The spin polarization 113 of the second semiconductor region 103, however, is opposite to the orientation of the spin polarization 111 of the first semiconductor region 101. Thus, the spin polarization 113 of the second semiconductor region 103 is up if the spin polarization 111 of the first semiconductor region 101 is down, or down if the spin polarization 111 of the first semiconductor region 101 is up.

The majority carrier in the first semiconductor region 101 can be an electron having a spin up, and the minority carrier in the first semiconductor region 101 is an electron having a spin down. Correspondingly, the majority carrier in the second semiconductor region 103 is an electron having a spin down, and the minority carrier in the second semiconductor region 103 is an electron having a spin up.

The majority carrier in the first semiconductor region 101 can also be an electron having a spin down, and the minority carrier in the first semiconductor region 101 is an electron having a spin up. Correspondingly, the majority carrier in the second semiconductor region 103 is an electron having a spin up, and the minority carrier in the second semiconductor region 103 is an electron having a spin down.

In another embodiment of the present invention (not shown), each of the first semiconductor region and the second semiconductor region comprises a p-type semiconductor layer, wherein the p-type semiconductor layer of the first semiconductor region is ferromagnetic, and the spin polarization of the first semiconductor region is either up or down. Moreover, the p-type semiconductor layer of the second semiconductor region is ferromagnetic, and the spin polarization of the second semiconductor region is either up if the spin polarization of the first semiconductor region is down, or down if the spin polarization of the first semiconductor region is up.

The majority carrier in the first semiconductor region can be a positive hole having a spin up, and the minority carrier in the first semiconductor region can be a positive hole having a spin down. Correspondingly, the majority carrier in the second semiconductor region is a positive hole having a spin down, and the minority carrier in the second semiconductor region is a positive hole having a spin up.

The majority carrier in the first semiconductor region can also be a positive hole having a spin down, and the minority carrier in the first semiconductor region is a positive hole having a spin up. Correspondingly, the majority carrier in the second semiconductor region is a positive hole having a spin up, and the minority carrier in the second semiconductor region is a positive hole having a spin down.

The spin deletion layer 102 may be characterized as a Neel wall or a Block wall. The thickness of the spin deletion layer 102, defined by the first side 112 and the second side 114, is at least partially determined by the ratio between the magnetic anisotropy energy and the magnetic stiffness of the first semiconductor region 101 and the second semiconductor region 103, as discussed in more detail below.

Figure 3:
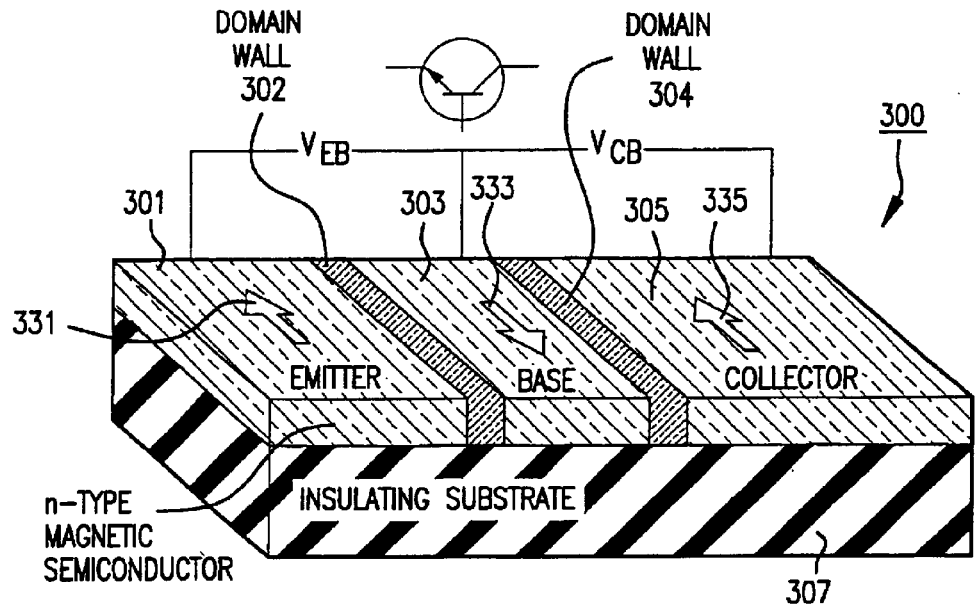
FIG. 3 is a perspective view of a unipolar spin transistor in one embodiment of the present invention.
Figure 4:
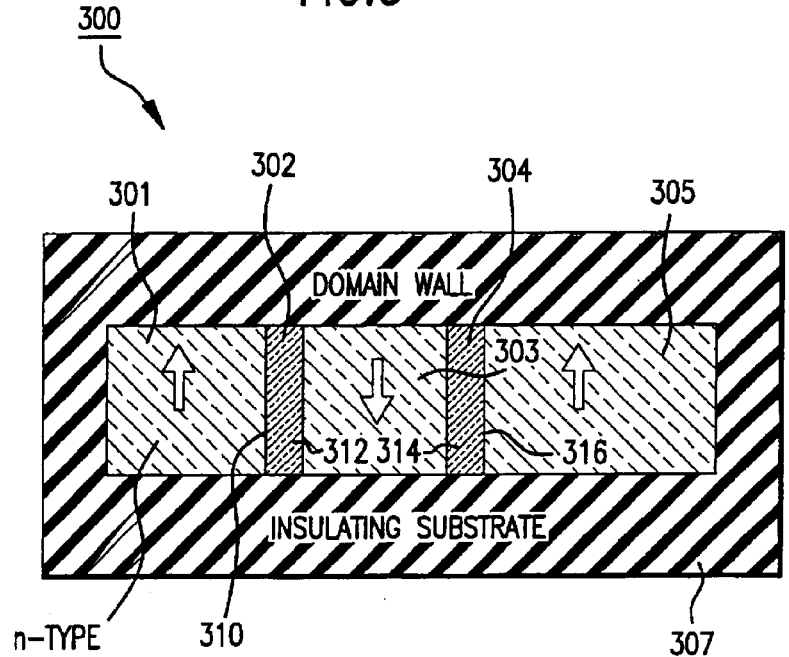
FIG. 4 is a top view of a unipolar spin transistor of FIG. 3.

In a further aspect, the present invention provides a unipolar spin transistor 300. In one embodiment of the present invention as shown in FIGS. 3 and 4, the unipolar spin transistor 300 includes a first semiconductor region 301 having a conductivity type and a first spin polarization 331. The unipolar spin transistor 300 also includes a second semiconductor region 303 having a conductivity type that is the same conductivity type of the first semiconductor region 301, and a second spin polarization 333 that is different from the first spin polarization 331 of the first semiconductor region 301, in other words, the orientation of the second spin polarization 333 is opposite to the orientation of the first spin polarization 331. The unipolar spin transistor 300 also includes a third semiconductor region 305 having a conductivity type that is the same conductivity type of the first semiconductor region 301 and a third spin polarization 335 that has the same orientation as the first spin polarization 331.

The first semiconductor region 301 and the second semiconductor region 303 are adjacent to each other so as to form a first spin depletion layer or domain wall 302 therebetween. The first spin depletion layer 302 has a first side 310 facing the first semiconductor region 301 and an opposing second side 312 facing the second semiconductor region 303. Additionally, the second semiconductor region 303 and the third semiconductor region 305 are adjacent to each other so as to form a second spin depletion layer or domain wall 304 therebetween. The second spin depletion layer 304 has a first side 314 facing the second semiconductor region 303 and an opposing second side 316 facing the third semiconductor region 305.

The unipolar spin transistor 300 is constructed so that when a majority carrier in the first semiconductor region 301 moves across the first spin depletion layer 302 from the first side 310 to the second side 312 of the first spin depletion layer 302, the majority carrier in the first semiconductor region 301 becomes a minority carrier in the second semiconductor region 303, and moreover, when the minority carrier in the second semiconductor region 303 moves across the second spin depletion layer 304 from the first side 314 to the second side 316 of the second spin depletion layer 304, the minority carrier in the second semiconductor region 303 becomes a majority carrier in the third semiconductor region 305.

Likewise, when a majority carrier in the third semiconductor region 305 moves across the second spin depletion layer 304 from the second side 316 to the first side 314 of the second spin depletion layer 304, the majority carrier in the third semiconductor region 305 becomes a minority carrier in the second semiconductor region 303, and when the minority carrier in the second semiconductor region 303 moves across the first spin depletion layer 302 from the second side 312 to the first side 310 of the first spin depletion layer 302, the minority carrier in the second semiconductor region 303 becomes a majority carrier in the first semiconductor region 301.

Thus, as constructed, the unipolar spin transistor 300 has characteristics in which majority carriers in the first, second, and third semiconductor regions 301, 303 and 305 have the same charge polarity but alternating spin orientations.

In one embodiment of the present invention (not shown), each of the first semiconductor region 301, the second semiconductor region 303 and the third semiconductor region 305 comprises a p-type semiconductor layer. The p-type semiconductor layer of the second semiconductor region 303 is ferromagnetic. The spin polarization of the second semiconductor region 303 can be either up or down.

Moreover, the p-type semiconductor layer of the first semiconductor region 301 and the p-type semiconductor layer of the third semiconductor region 305 are also ferromagnetic. The spin polarization 331 of the first semiconductor region 301 and the spin polarization 335 of the third semiconductor region 305 are up if the spin polarization 333 of the second semiconductor region 303 is down, or down if the spin polarization 333 of the second semiconductor region 303 is up, i.e., the spin orientations of the first, second and third semiconductor regions 301, 303 and 305 are alternating.

In another embodiment of the present invention as shown in FIGS. 3 and 4, each of the first semiconductor region 301, the second semiconductor region 303 and the third semiconductor region 305 comprises an n-type semiconductor layer. The n-type semiconductor layer of the second semiconductor region 333 is ferromagnetic. The spin polarization 303 of the second semiconductor region 303 can be either up or down. Moreover, the n-type semiconductor layer of the first semiconductor region 301 and the n-type semiconductor layer of the third semiconductor region 305 are ferromagnetic. The spin polarization 331 of the first semiconductor region 301and the spin polarization 333 of the third semiconductor region 303 are up if the spin polarization 333 of the second semiconductor region 303 is down, or down if the spin polarization 333 of the second semiconductor region 333 is up.

In term of the art, the first semiconductor region 301 is the emitter, the second semiconductor region 303 is the base, and the third semiconductor 305 is the collector.

Each of the first spin deletion layer 302 and the second spin deletion layer 304 may be characterized as a Neel wall or a Block wall. The thickness of each of the first spin deletion layer 302 and the second spin deletion layer 304 is at least partially determined by the ratio between the magnetic anisotropy energy and the magnetic stiffness of the first semiconductor region 301 and the second semiconductor region 303, and the second semiconductor region 303 and the third semiconductor region 305, respectively.

The transistor 300 may further include a substrate 307 that supports the first semiconductor region 301, the second semiconductor region 303 and the third semiconductor region 305. The substrate 307 can be made from an insulating material or a semi-insulating material.

Still referring to FIGS. 3 and 4, transistor 300 can be utilized to change amplitude of electric signals. In one embodiment of the present invention, a first voltage $V_{EB}$ is provided between the first region 301 and the second region 303 to cause carriers (either electrons or holes) to move across the first domain 302 from the first region 301 to the second region 303, i.e., from emitter to base. A second voltage $V_{CB}$ is generated between the second region 303 and the third region 305, i.e., emitter and collector, to cause the carriers move across the second domain 304 from the second region 303 to the third region 305. The second voltage $V_{CB}$ has an amplitude different from that of the first voltage $V_{EB}$.

Many applications can be found for unipolar spin transistor 300. In one embodiment, the present invention can be utilized to provide a non-volatile memory. Currently, available non-volatile memory, which does not lose its information when the power is turned off, relies on floating gate transistors (EPROM), which are very slow in the write phase. Magnetic field pulses are, in comparison, very fast. Thus, unipolar transistors of the present invention can be utilized to provide a memory because the voltage-current relation of the device can be changed when the magnetization of domains is reoriented. Once changed and the external magnetic field is off, the magnetization direction is very stable (i.e. non-volatile). Thus, the present invention can provide a memory device that has the magnetic semiconducting material with the proper arrangement of magnetic domains and contacts to allow for the detection of the magnetic domain configuration (for example, parallel or antiparallel magnetization directions), and a process by which information is encoded in the memory device by switching the magnetization directions with a local external magnetic field.

Figure 7:
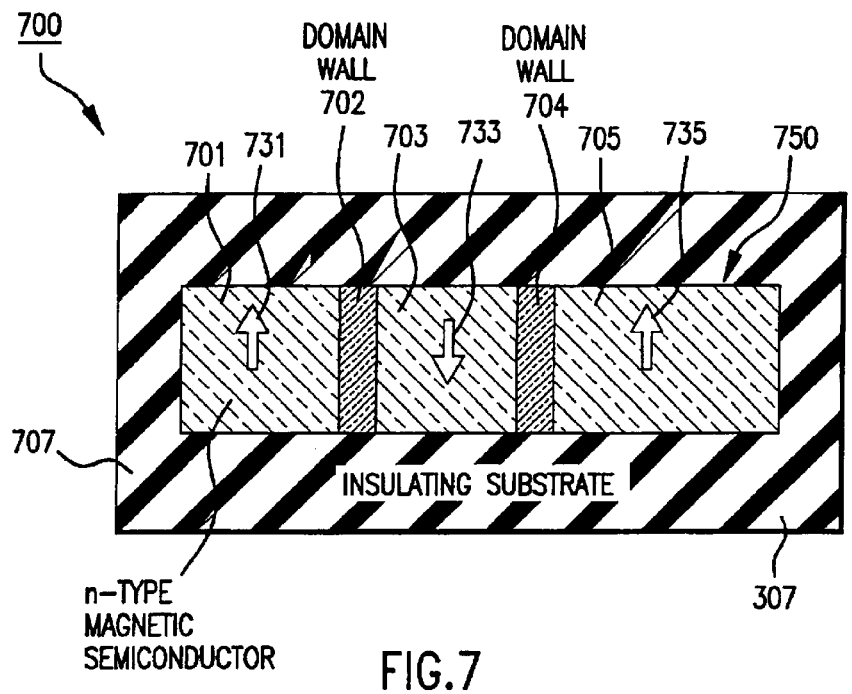
FIG. 7 schematically shows a non-volatile memory using a unipolar spin transistor in one embodiment of the present invention indicating the unipolar spin transistor in a high resistance state.
Figure 8:
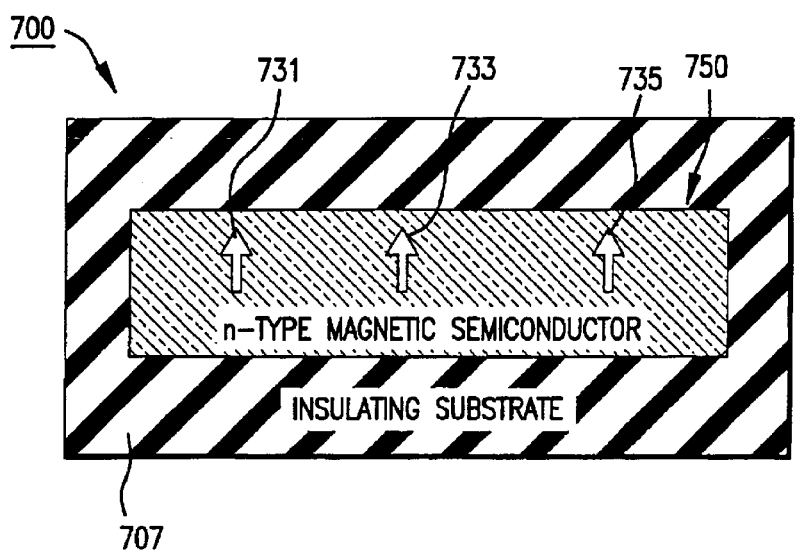
FIG. 8 is same as FIG. 7 but indicating the unipolar spin transistor in a low resistance state.

More specifically, referring now to FIGS. 7 and 8, in another aspect, the present invention provides a memory cell 700 having a unipolar spin transistor for nonvolatile memory applications for storing a data state corresponding to one of a first and a second logical data values. In one embodiment of the present invention, the memory cell 700 includes a magnetic semiconductor material 750 having a first region 701, a second region 703, and a third region 705. The first region 701 is adjacent to the second region 703 so as to form a first domain 702 between the first region 701 and the second region 703, and the second region 703 is adjacent to the third region 705 so as to form a second domain 704 between the second region 703 and the third region 705. Moreover, the first region 701 has a first spin polarization 731, the second region has a second spin polarization 733, and the third region 705 has a third spin polarization 735. Each of the first spin polarization 731, the second spin polarization 733, and the third spin polarization 735 can be up or down.

The ferromagnetic semiconductor material 750 is in a high-resistance state when the second spin polarization 739 of the second region 703 is opposite to the first spin polarization 331 of the first region 301 and the third spin polarization 335 of the third region 305, which are always identical or parallel to each other, as shown in FIG. 7. Likewise, the ferromagnetic semiconductor material 750 is in a low-resistance state when the second spin polarization 733 of the second region 703 is aligned to the first spin polarization 731 (and the third spin polarization 735) of the first and third regions, as shown in FIG. 8. The memory cell 700 can store the first logical value such as "0" when the ferromagnetic semiconductor material 750 is in the high-resistance state, and store the second logical value such as "1" when the ferromagnetic semiconductor material 750 is in the low-resistance state. The memory is retained until a different state is stored in the cell. A memory can include a plurality of memory cells to store any data that can be described by a combination of "0" and "1".

The orientation of the second spin polarization 733 can be altered by an external magnetic field to become one of aligned and opposite to the orientation of the first spin polarization 731 (and the third spin polarization 735). In one embodiment, the first region comprises an emitter of the unipolar spin transistor, the second region comprises a base of the unipolar spin transistor and the third region comprises a collector of the unipolar spin transistor. The magnetic semiconductor material can be chosen from a variety of magnetic materials such as GaMnAs, TiCoO2, BeMnZnSe and the like. In other words, a memory cell 700 comprises a unipolar spin transistor provided by the present invention.

In another embodiment, the present invention can be utilized to provide a magnetic field sensor. The current materials used for magnetic field sensing (giant magnetoresistance, GMR or magnetic tunnel junction, MTJ) rely on linear changes of resistance depending on magnetic field orientation. In contrast, a unipolar transistor of the present invention has an exponential dependence of the charge current on the applied magnetic field as discussed in more detail below. A sensor can be implemented through allowing an external magnetic field to switch the base magnetization direction. In this case the resistance of both the high resistance and low resistance orientations are much larger than those of metallic magnetic systems. Thus the power requirements are lower. Applications of these magnetic field sensors include magnetic read heads or automobile ignition systems. Thus, the present invention provides a device that has a magnetic semiconducting material with the proper arrangement of magnetic domains and contacts to allow for the detection of external magnetic fields, and a process by which the desirable orientation of the magnetic domains are determined to make the desired device.

Figure 9:
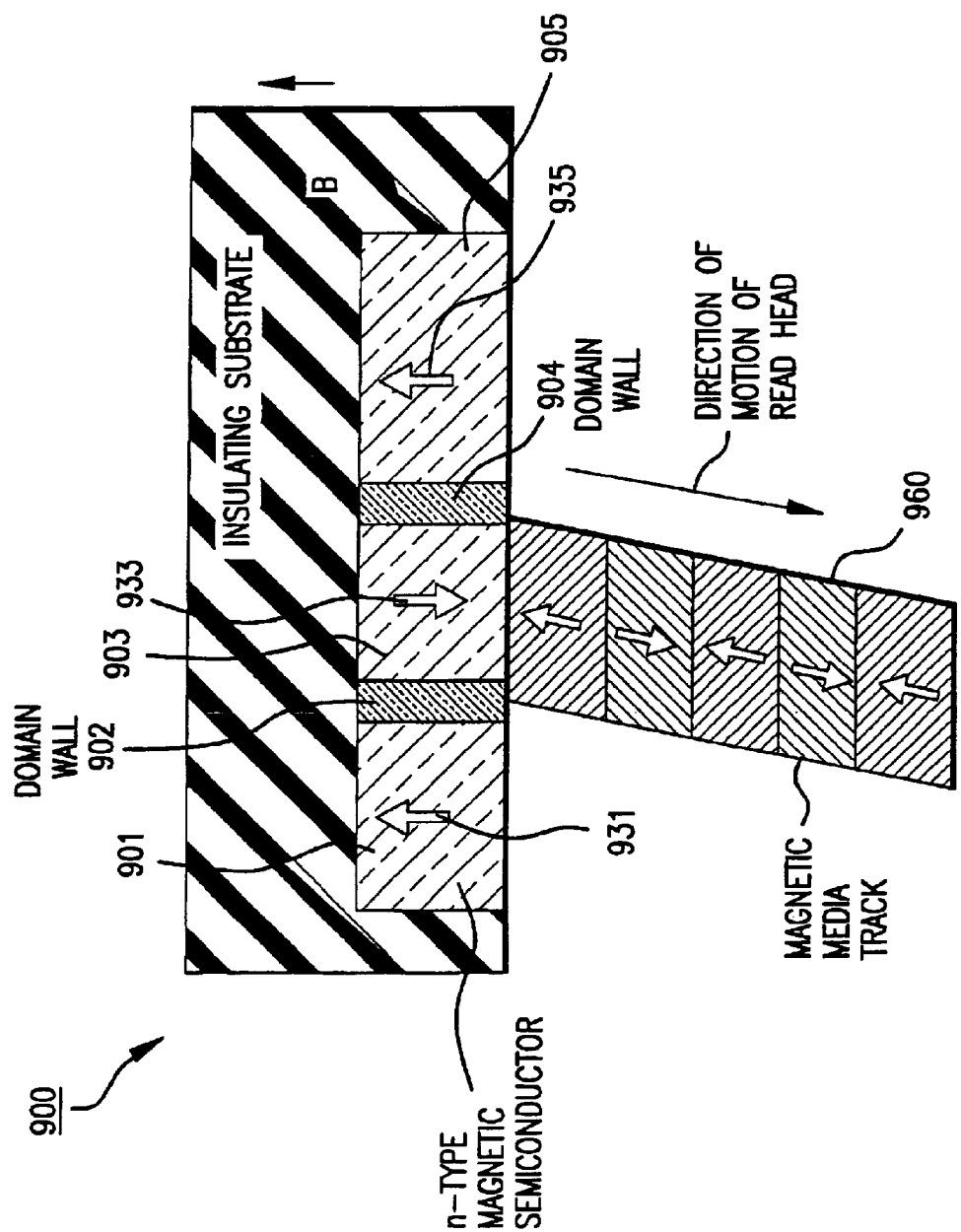
FIG. 9 schematically shows a magnetic filed sensor using a unipolar spin transistor in one embodiment of the present invention.

More specifically, referring now to FIG. 9, the present invention provides an apparatus of operating a unipolar spin transistor 900 for detecting magnetic field. The unipolar spin transistor 900 includes a ferromagnetic semiconductor material 950 having a first region 901, a second region 903, and a third region 905, wherein the first region 901 is adjacent to the second region 903 so as to form a first domain 902 between the first region 901 and the second region 903, and the second region 903 is adjacent to the third region 905 so as to form a second domain 904 between the second region 903 and the third region 905. The first region 901 has a first spin polarization 931, the second region 903 has a second spin polarization 933, and the third region 905 has a third spin polarization 935. Each of the first spin polarization 931, the second spin polarization 933, and the third spin polarization 935 can be up or down. The first spin polarization 931 and the spin polarization 935 are identical or parallel to each other. The ferromagnetic semiconductor material 950 is in a high-resistance state when the second spin polarization 933 of the second region 903 is opposite to the first spin polarization 931 of the first and third regions 901, 905, and the ferromagnetic semiconductor material 950 is in a low-resistance state when the second spin polarization 933 of the second region 903 is aligned to the first spin polarization 931 of the first and third regions 901, 905.

In operation, the spin transistor 900 can be associated with a read head (not shown) to form a magnetic field sensor. The second region 903 is subjected to a test area such as a magnetic media track 960, where the presence of an external magnetic field can be determined. Because the presence of an external magnetic field (B) causes the status of the ferromagnetic semiconductor material 950 to alter from one of the high-resistance state and the low-resistance state to another, measuring the status of the ferromagnetic semiconductor material 950 will determine whether an external magnetic field is present.

Additionally, as discussed further below, one principal effect of an external magnetic field (B) on any section 901, 903 or 905 of the spin transistor 900 is to shift the minority band edge 612 shown in FIG. 6. In other words, the barrier height for minority carriers in the second region 903 is changeable with the presence of an external magnetic field (B). The change of the barrier height for minority carriers in the second region 903 in turn causes the resistance of the ferromagnetic semiconductor material 950 to change, which can then be measured for detecting the presence of an external magnetic field. Thus, in another embodiment (not shown), the present invention provides a magnetic field sensor that has a spin transistor 900. The second region 903 is subjected to a test area such as a magnetic media track 960, where the presence of an external magnetic field can be determined. Because the presence of an external magnetic field (B) causes the resistance of the ferromagnetic semiconductor material 950 to change from one value to another, measuring the resistance of the ferromagnetic semiconductor material 950 can determine whether an external magnetic field is present.

In yet another embodiment, the present invention can be utilized in reprogrammable logic process. As known to people skilled in the art, different logic functions are performed by different arrangements of transistors, but in ordinary chip it is not feasible to rewire bi-polar transistors to change the function of chip. For chips having unipolar transistors of the present invention, however the "wiring" of a chip can be changed in real time through an external magnetic field that switches the magnetization of regions of the ferromagnetic material. Thus, the present invention provides an apparatus that has the semiconducting material with different magnetic domains that can perform different logic operations depending on the orientation of magnetic domains. The present invention also provides a process by which the desired magnetic orientations are decided to generate the desired logical activity of the chip.

Figure 10:
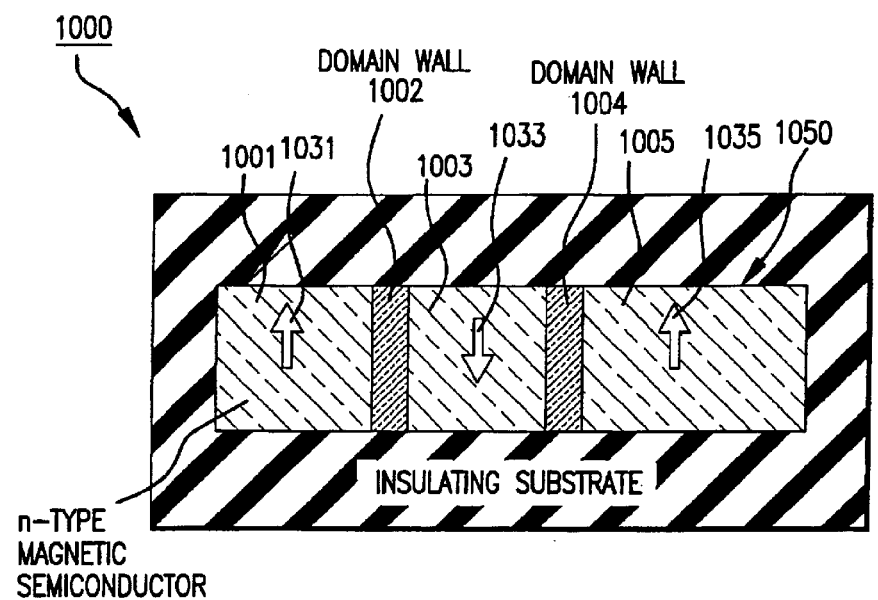
FIG. 10 schematically shows a reprogrammable logic element using a unipolar spin transistor in one embodiment of the present invention indicating the unipolar spin transistor in a transistor configuration.
Figure 11:
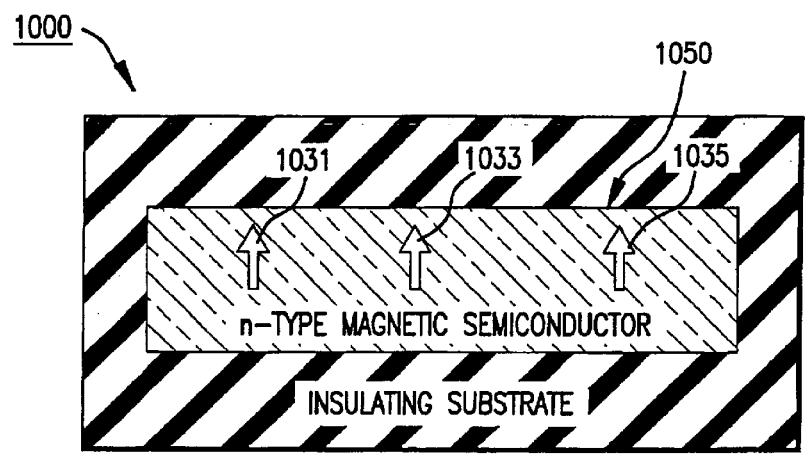
FIG. 11 is same as FIG. 10 but indicating the unipolar spin transistor in a "wire" configuration.

More specifically, referring now to FIG. 10, the present invention provides an apparatus of operating a unipolar spin transistor 1000 in a reprogrammable logic process that is determined by a combination of input logic signals. The unipolar spin transistor 1000 includes a ferromagnetic semiconductor material 1050 having a first region 1001, a second region 1003, and a third region 1005. The first region 1001 is adjacent to the second region 1003 so as to form a first domain 1002 between the first region 1001 and the second region 1003, and the second region 1003 is adjacent to the third region 1005 so as to form a second domain 1004 between the second region 1003 and the third region 1005. The first region 1001 has a first spin polarization 1031, the second region has a second spin polarization 1033, and the third region 1005 has a third spin polarization 1035. Each of the first spin polarization 1031, the second spin polarization 1033, and the third spin polarization 1035 can be up or down. However, the first spin polarization 1031 and the third spin polarization 1035 are identical or parallel to each other. The ferromagnetic semiconductor material 1050 is in a first non-volatile state when the second spin polarization 1033 of the second region 1003 is opposite to the first spin polarization 1031 of the first region 1001 (and the third region 1005) as shown in FIG. 10. The ferromagnetic semiconductor material 1050 is in a second non-volatile state when the second spin polarization 1933 of the second region 1003 is aligned to the first spin polarization 1031 of the first region 1001 (and the third region 1005) as shown in FIG. 11. Each of the first and second non-volatile states can represent a binary value such as a "0" or "1".

In operation, a chip containing a spin transistor 1000 which is in one non-volatile state can be subjected to a magnetic field to cause the state of the ferromagnetic semiconductor material to alter from one of the first and second non-volatile states to, another, thereby generating a new binary value relating to a new input logic signal. The new binary value relating to a new input logic signal can be stored so as to reprogram a logic process. In the embodiment as shown in FIGS. 10 and 11, the state is changed from a transistor configuration as shown in FIG. 10 to a "wire" configuration as shown in FIG. 11 indicating a new logic process is implemented. More complicated process can be implemented through a plurality of unipolar spin transistors.

The invention may be further understood by reference to the following illustrative samples and corresponding discussions. Some theoretical aspects of the invention are given to help a reader to understand the invention. However, we do not intend to be bound by any theory of device operation and we note that the theory of device operation for both diode and transistor is independent of the microscopic nature of current (both spin and charge) transport in the diode and transistor.

Further Disclosure and Discussion of the Invention

Among other things, the present invention provides two fundamental devices. The first, as discussed above, is a spin diode such as spin diode 100 as shown in FIG. 1 that has two layers with anti-parallel majority carrier spin polarization and is in many ways similar to the MTJ devices based on metals. The second is a three-layer configuration with alternating majority carrier spin polarization, which has been identified as a spin transistor 300 as shown in FIG. 3. These two devices can function in a similar way to GMR or MTJ devices, in which the resistance of the device changes due to a change in the magnetization direction of one layer. As the parallel configuration (or "low-resistance state") would be of higher resistance than that of the GMR or MTJ devices, these devices should use less power in nonvolatile memory applications.

Among many of the novel aspects of these devices, we will emphasize in this section the presence of charge current gain in the spin transistor and the sensitivity of this gain to magnetic field. Specifically, the I–V characteristics—unlike those of devices based on magnetic metals available in prior art—are inherently nonlinear. This provides new modes of operation of these devices in a variety of applications including reprogrammable logic, nonvolatile memory, and magnetic sensing.

In our presentation of the current-voltage characteristics of the spin transistor we will frequently allude to a fundamental analogy between unipolar ferromagnetic semiconductors and nonmagnetic bipolar materials. This analogy is best visualized in the relationship between a spin diode and the traditional p-n diode. Shown in FIG. 5(a) are the band edges 501, 503 of the conduction and valence band for a traditional p-n diode 500 in equilibrium, respectively. The quasifermi levels 505 are shown as dashed lines. To assist in exploring the analogy with the spin diode 100, FIG. 5(b) shows the energies of the elementary carriers in those bands: conduction electrons 507 and valence holes 509. This unfamiliar diagram is obtained merely by noting that the energy of a hole in the valence band is the negative of the energy of the valence electron (relative to the chemical potential). We introduce FIG. 5(b) in order to point out the similarities with the band edges for the spin diode 100. Shown in FIG. 5(c) are those band edges 510, 512, which are also the carrier energies. Just, as for the p-n diode, in the unipolar spin diode 100 the majority carriers on one side are the minority carriers on the other side.

A major difference, however, is that the two types of carriers in the p-n diode 500 have opposite charge, whereas in the spin diode 100 they have the same charge. One implication of this difference is that in the p-n diode 500 the interface 502 or domain between the layers is a charge depletion layer whereas in the spin diode 100 the interface 102 is a spin depletion layer. The difference in physics between the two cases will be explored more below. Another major difference resulting from the charges of the carriers is the way the carrier energies shift under bias.

Figure 5:
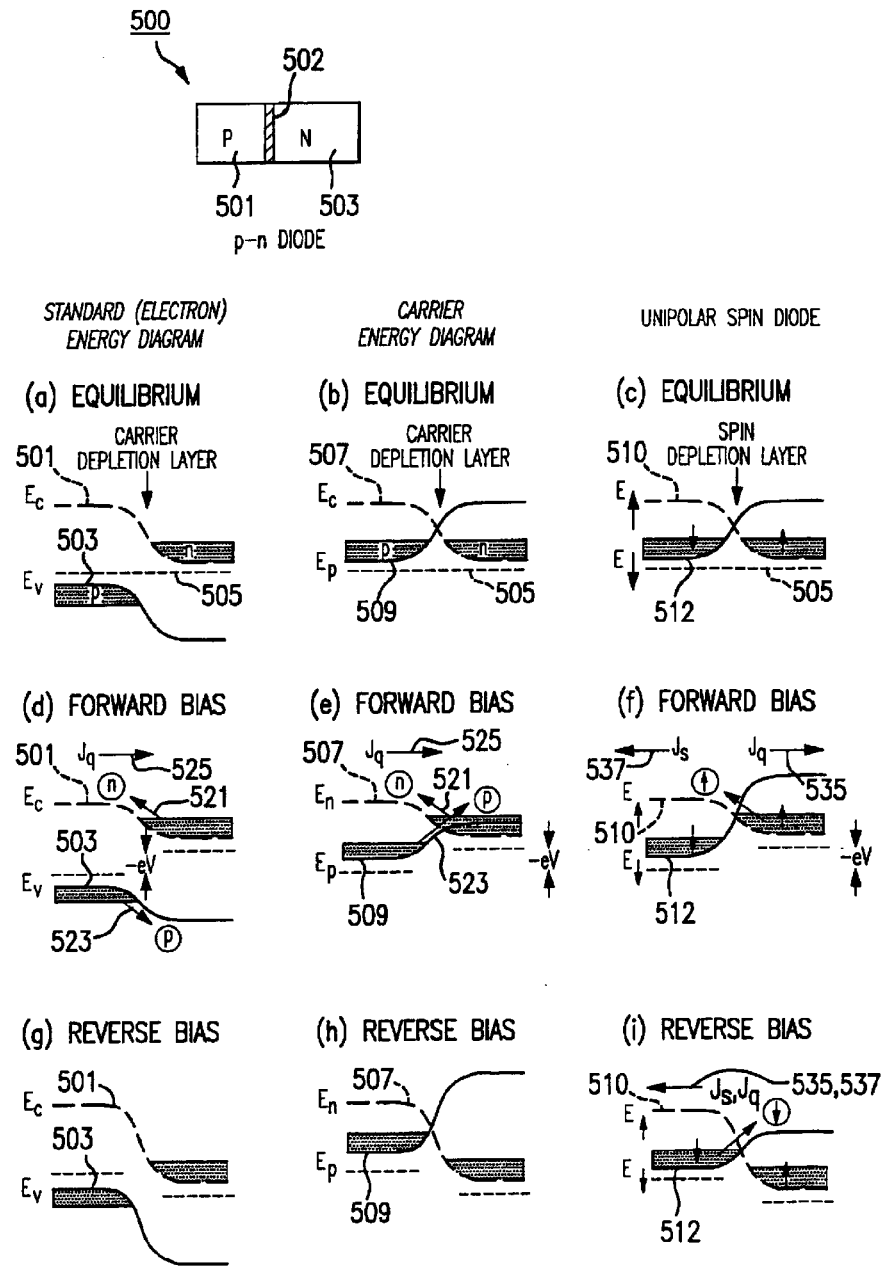
FIG. 5 illustrates a partial band diagram for the diode as shown in FIG. 1, where standard and carrier energy diagrams are given for a traditional p-n diode vs. unipolar spin diode under equilibrium conditions (a)–(c), forward bias (d)–(f), and reverse bias (g)–(i), respectively.

In the p-n diode 500 under forward bias the barriers for both valence hole and conduction electron transport across the junction are reduced. As shown in FIGS. 5(d,e) this fact leads to an increase in the conduction electron current 521 to the left and the valence hole current 523 to the right. Because the carriers have opposite charge, both increases result in an increased charge current 525 to the right. For the spin diode 100 only the barrier for spin up electrons moving to the left is reduced—the barrier for spin down electrons moving to the right is increased. The charge current 535 is thus directed to the right and the spin current 537 to the left. Under reverse bias the barriers for carrier transport are both increased in the p-n diode 100 (FIGS. 5(g,h)), yielding rectification of the charge current. For the spin diode (FIG. 5(i)), as before one barrier is reduced and the other increased. Thus the charge current is not rectified but the spin current is applying analogous assumptions to the Shockley assumptions for an ideal diode (the validity of these assumptions will be discussed below), we find the charge current density $J_q$ and the spin current density $J_s$ depend on the voltage V according to:

$$J_q = 2qJ_o \sin h(qV/kT), \quad (1)$$

$$J_s = 2hJ_o \sin h(qV/2kT) \times \sin h(qV/2kT), \quad (2)$$

where $J_o = D\, n_m/L_m$, q is the electron charge, V is the voltage, k is Boltzmann's constant, T is the temperature, h is the Planck's constant, D is the diffusion Constant, $n_m$ is tile minority carrier density, and $L_m$ is the minority spin diffusion length. The resulting spin polarization of tile current is $$P = (2qJ_s/hJ_q) = \tan h(qV/2kT). \quad (3)$$

Thus the spin polarization approaches unity as V gets large, and approaches 0 for small V. The relative directions of the charge and spin Currents are shown on FIG. 5 for the cases of forward and reverse bias.

Tunneling occurs in the spin diode, as it can in the p-n diode, but with somewhat different character. For voltages smaller than the spin splitting of minority and majority carriers tunneling is very weak. For voltages larger than this, tunneling is much more probable. This characteristic may help make a symmetric voltage regulator, with a maximum voltage determined by the spin splitting (which can be influenced by an external magnetic field).

Figure 6:
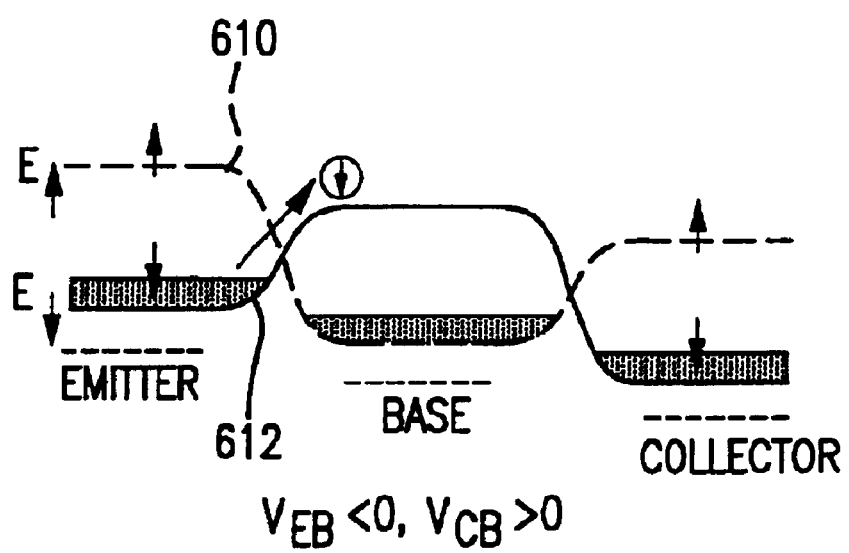
FIG. 6 shows carrier energy diagrams for the unipolar spin transistor of FIG. 4 in the normal active configuration.

For ease of use as components in integrated circuits, a magneto electronic device should allow for magnetic manipulation of the charge current gain—to achieve this we describe the spin transistor 300, shown in FIGS. 3 and 6, in addition to the discussion above. Analyzing this structure in a similar way to a bipolar nonmagnetic transistor, the collector current density is $$I_C = -[qJ_o/\sin h(W/L)][(\exp(-qV_{EB}/kT)-1)-(\exp(-qV_{CB}/kT)-1)\cos h(W/L)] + [qJ_o/L][\exp(-qV_{CB}/kT)-1], \quad (4)$$

and the emitter current is $$I_E = -[qJ_o/\sin h(W/L)][\exp(-qV_{EB}/kT)-1)\cos h(W/L)-(\exp(-qV_{CB}/kT)-1)] + [qJ_o][\exp(-qV_{EB}/kT)-1]. \quad (5)$$

The base width is W, the voltage between emitter and base is $V_{BE}$, and the voltage between collector and base is $V_{CB}$. The base current is $I_B = I_E - I_C$. When W/L is small, $I_B \ll I_C$, which is the desired situation for transistor operation (current gain $I_C/I_B \gg 1$). For appropriate values of $V_{EB}$ and $V_{CB}$ ($V_{EB} < 0$ and $V_{CB} > 0$)

$$I_C = -[qJ_o/\sin h(W/L)][(\exp(-qV_{EB}/kT)-1)+\cos h(W/L)]-[qJ_o][\exp(-qV_{CB}/kT)-1], \quad (6)$$

and the emitter current is $$I_E = -[qJ_o/\sin h(W/L)][(\exp(-qV_{EB}/kT)-1)\cos h(W/L)+1]-[qJ_o]. \quad (7)$$

The "emitter efficiency" γ, defined as the ratio of the majority spin-direction charge current $I_{E\downarrow}$ to the total emitter current $I_E$ [13], is $[1=\exp(-qV_{EB}/kT)]$ and thus very close to one. However, in contrast to bipolar nonmagnetic transistors, the "collector multiplication factor" M, defined as the ratio between the full collector current $I_C$ and the majority spin-direction charge current $I_{C\downarrow}$ [13], is given by $$M=1+\sin h(W/L)\exp[q(V_{CB}+V_{EB})/kT], \qquad (8)$$

which is close to 1 only if W/L is small.

Thus we have shown that it should be possible to program a logical circuit which behaves like a bipolar logical circuit, using a uniformly-doped unipolar magnetic material. The "p"—like regions correspond to regions with the magnetization pointing one way (z) and the "n"—like regions correspond to region with the magnetization pointing along direction (−z). Such logical circuits can include memory circuits, thus indicating that nonvolatile memory can be constructed as discussed above. The orientation of the magnetic domains can be straightforwardly performed in a lateral geometry using similar techniques as for magnetic metallic memories [1]. By incorporating both the logical elements and the connections between them in a single architecture, fabrication of such devices should be more straightforward than a hybrid magnetic metal and semiconductor electronic device architecture.

We now turn to magnetic sensing applications. For GMR and MTJ devices the sensing is performed by allowing the magnetization of one layer to rotate easily in the presence of an external field, and observing the resistance change. Of course the spin diode could perform this way as well. The spin transistor, however, can detect magnetic fields sensitively even when the magnetization direction of the semiconductor layers is unchanged.

The effect of an external magnetic field on any section of the spin transistor 300 is principally to shift the minority band edge. If the chemical potential is pinned by the external circuit the majority band edge does not move significantly. Thus the spin transistor 300 is a minority-spin device (in contrast to the "spin field-effect transistor" [14], which is a majority-spin device). The collector and emitter currents in the presence of magnetic fields $B_E$, $B_B$, and $B_C$ applied to the emitter, the base, and the collector respectively are $$I_C=-[qJ_o/\sin h(W/L)][(\exp([-qV_{EB}-g\mu B_B]/kT)-1)+\cos h(W/L)]- [qJ_o][\exp([qV_{CB}+g\mu B_C]/kT)-1], \qquad (9)$$

$$I_E=-[qJ_o/\sin h(W/L)][(\exp([-qV_{EB}-g\mu B_B]/kT)-1)\cos h(W/L)+1]- [qJ_o/]. \qquad (10)$$

Here g is the g-factor and $\mu$ is the magnetic moment of the electron. These currents depend exponentially on the magnetic fields applied to the base and the collector, but not on the emitter field $B_E$. Materials such as BeMnZnSe have g-factors close to 1000 [7], thus yielding a change in current of roughly 0.01% per gauss at room temperature, however materials with still larger g-factors may yet be found (typical sensitivity of GMR, devices is 1% galiss). We also note that an electrically isolated magnetic field amplifier can be employed—namely a small magnetic element which is free to rotate in response to the external field, and can produce a larger field at the spin transistor base layer, or the base magnetization itself can be rotated.

We now revisit the Shockley assumptions for an ideal diode according to the present invention, noting that a diode 100 according to the present invention need not be perfect to operate. These are (1) the bulk of the voltage drop takes place across the depletion region, (2) the Boltzmann approximation for transport is valid, (3) the minority carrier densities are small compared to majority carrier densities, and (4) no generation currents exist in the depletion layer. Assumption (1) causes the greatest concern. The depletion region 102 in the spin diode 100 is very different than that of the p-n diode 500. In the p-n diode 500 the thickness of the charge depletion region 502 is set by the doping levels in the two regions 504, 506 and the band gap of the material. In the spin diode 100 the spin depletion region 102 is probably a Néel wall, and its thickness is set by the ratio between the magnetic anisotropy energy and the magnetic stiffness. The anisotropy energy can be adjusted through shape engineering. For optimal device performance of spin diodes and transistors, the domain wall should be very thin. In this limit, the spins of carriers passing through the domain wall will not process. When the domain wall is very thick, however, the electron spin will follow adiabatically the direction of the macroscopic magnetization and the device will believe like an ordinary metallic conductor, where the voltage drop is uniformly distributed along the device. In the general case, there is a finite probability that the electrons emerge from the spin depletion region with their spins flipped. We have analyzed this case and find that, due to the high resistivity of the no-spin-flip channel, the voltage drop still takes place mostly across the spin depletion region (assuming, of course, that spin coherence is maintained across the region), unless the probability of no spin flip is utterly negligible. The latter case can occur if majority spin orientation carriers from one side of the junction can directly tunnel into the majority spin orientation band of the opposite side, as opposed to being thermally excited above the exchange barrier into the minority spin orientation band. If loss of spin coherence become a serious problem, the domain wall can be replaced by a nonmagnetic region, as is currently done in MTJs. In the presence of the nonmagnetic region, the relevant length is the spin coherence length, which can be quite long.

The remaining three assumptions are of less concern. Assumption (2) commonly holds in semiconductor devices so long as the applied voltage is not too large. If the spin splitting in the magnetic regions is sufficiently large compared to the operation temperature then assumption (3) will hold. Assumption (4) relies on the spin coherence time greatly exceeding the transit time through the depletion region (for the spin diode) or the base (for the spin transistor). Measurements of long spin coherence times in semiconductors near room temperature [15,16] indicate this assumption is reasonable.

Other aspects of the invention may be found from the attached drawings and other related materials such as text in the drawings, which are an integral part of this disclosure. Moreover, other embodiments of the invention will be apparent to those skilled in the art from consideration of the specification and practice of the invention disclosed herein. Additionally, more background information can be found in the attached list of references. It is intended that the specification and examples be considered as exemplary only.

While there has been shown preferred and alternate embodiments of the present invention, it is to be understood that certain changes can be made in the form and arrangement of the elements of the system and steps of the method as would be know to one skilled in the art without departing from the underlying scope of the invention as is particularly set forth in the Claims. Furthermore, the embodiments described above are only intended to illustrate the principles of the present invention and are not intended to limit the claims to the disclosed elements.

CITATIONS

[1] G. Prinz, Science 282, 1660 (1998); 283, 330 (1999).
[2] M. Baibich et al., Phys. Rev. Lett. 61, 2472 (1988).

[3] J. M. Daughton, et al., IEEE Trans. Magn. 30, 4608 (1994).
[4] A Johnson, Phys. Rev. Lett. 70, 2142 (1993); A Johnson, J. Appl. Phys. 75, 6714 (1994).
[5] J. Moodera, L. Kinder, T. Wong, R. Meservey, Phys. Rev. Lett. 74 3273 (1995).
[6] A. Fert and S.-F. Lee, Phys. Rev. B 53, 6554 (1996).
[7] B. König, et al., Phys. Rev. B 60, 2653 (1999).
[8] H. Ohno et al., Appl. Phys. Lett. 73, 363 (1998); H. Obno, Science 281, 951 (1998).
[9] Y. Ohno, et al., Nature (London) 402, 790 (1999).
[10] A E. Flattéand J. M. Byers, Phys. Rev. Lett. 84 4220 (2000).
[11] I. D'Amico and G. Vignale, to be published.
[12] Y. Guo, et al., J. Appl. Phys. 83, 4545 (1998); J. (1998).
[13] S. M. Sze, *Physics of Semiconductor Devices*, 2$^{nd}$ edition (John Wiley Sons, New York, 1981), Chapter 3.
[14] S. Datta and B. Das, Appl. Pitys. Lett. 56, 665 (1990).
[15] J. M. Kikkawa, I. P. Smorchkova, N. Samarth, and D. D. Awsclialom, Science 277, 1284 (1997).
[16] Y. Ohno et al., Phys. Rev. Lett. 83, 4196 (1999).

What is claimed is:

1. A method of changing amplitude of electric signals, comprising the steps of:
  a. providing a semiconductor material having a first region, a second region, and a third region, wherein the first region is adjacent to the second region so as to form a first domain between the first region and the second region, and the second region is adjacent to the third region so as to form a second domain between the second region and the third region;
  b. providing a first voltage between the first region and the second region to cause carriers to move across the first domain from the first region to the second region; and
  c. generating a second voltage between the second region and the third region to cause the carriers move across the second domain from the second region to the third region and the second voltage has an amplitude different from that of the first voltage,
  wherein the first region and the third region have a first spin polarization, and the second region has a second spin polarization different from the first spin polarization; and
  wherein the carriers in each of the first, second and third regions have the same charge polarity.

2. The method of claim 1, wherein the first spin polarization is up, and the second spin polarization is down.

3. The method of claim 1, wherein the first spin polarization is down, and the second spin polarization is up.

4. The method of claim 1, wherein the carriers are electrons.

5. The method of claim 1, wherein the carriers are holes.

6. A memory cell having a unipolar spin transistor for nonvolatile memory applications for storing a data state corresponding to one of a first and a second logical data values, comprising:
  a magnetic semiconductor material having a first region, a second region, and a third region, wherein the first region is adjacent to the second region so as to form a first domain between the first region and the second region, and the second region is adjacent to the third region so as to form a second domain between the second region and the third region;
  wherein the first region and the third region have a first spin polarization, the second region has a second spin polarization, and each of the first spin polarization and the second spin polarization can be up or down;
  wherein the ferromagnetic semiconductor material is in a high-resistance state when the second spin polarization of the second region is aligned to the first spin polarization of the first and third regions, and the ferromagnetic semiconductor material is in a low-resistance state when the second spin polarization of the second region is opposite to the first spin polarization of the first and third regions; and
  wherein the memory cell stores the first logical value when the ferromagnetic semiconductor material is in the high-resistance state, and the memory cell stores the second logical value when the ferromagnetic semiconductor material is in the low-resistance state.

7. The memory cell of claim 6, wherein the orientation of the second spin polarization can be altered by an external magnetic field to become one of aligned and opposite to the orientation of the first spin polarization.

8. The memory cell of claim 7, wherein the first region comprises an emitter of the unipolar spin transistor, the second region comprises a base of the unipolar spin transistor and the third region comprises a collector of the unipolar spin transistor.

9. The memory cell of claim 6, wherein the memory is retained until a different state is stored in the cell.

10. The memory cell of claim 6, wherein the magnetic semiconductor material comprises a material selected from the group of GaMnAs, TiCoO2, and BeMnZnSe.

11. A method of operating a unipolar spin transistor for nonvolatile memory applications for storing a data state corresponding to one of a first and a second logical data values, wherein the unipolar spin transistor comprises:
  a magnetic semiconductor material having a first region, a second region, and a third region, wherein the first region is adjacent to the second region so as to form a first domain between the first region and the second region, and the second region is adjacent to the third region so as to form a second domain between the second region and the third region;
  wherein the first region and the third region have a first spin polarization, the second region has a second spin polarization, and each of the first spin polarization and the second spin polarization can be up or down; and
  wherein the ferromagnetic semiconductor material is in a high-resistance state when the second spin polarization of the second region is opposite to the first spin polarization of the first and third regions, and the ferromagnetic semiconductor material is in a low-resistance state when the second spin polarization of the second region is aligned to the first spin polarization of the first and third regions,
  the method comprising the steps of:
  a. altering the orientation of the second spin polarization to become one of aligned and opposite to the orientation of the first spin polarization; and
  b. storing the first logical data value when the ferromagnetic semiconductor material is in the high-resistance state, and storing the second logical value when the ferromagnetic semiconductor material is in the low-resistance state.

12. The method of claim 11, wherein the orientation of the second spin polarization can be altered by an external magnetic field.

13. A method of operating a unipolar spin transistor for detecting a magnetic field, wherein the unipolar spin transistor comprises:
  a magnetic semiconductor material having a first region, a second region, and a third region, wherein the first region is adjacent to the second region so as to form a first domain between the first region and the second region, and the second region is adjacent to the third region so as to form a second domain between the second region and the third region;

wherein the first region and the third region have a first spin polarization, the second region has a second spin polarization, and each of the first spin polarization and the second spin polarization can be up or down; and wherein the ferromagnetic semiconductor material is in a high-resistance state when the second spin polarization of the second region is opposite to the first spin polarization of the first and third regions, and the ferromagnetic semiconductor material is in a low-resistance state when the second spin polarization of the second region is aligned to the first spin polarization of the first and third regions, the method comprising the steps of:
  a. subjecting the second region to a test area;
  b. measuring the status of the ferromagnetic semiconductor material; and
  c. determining the presence of an external magnetic field, wherein the presence of an external magnetic field causes the status of the ferromagnetic semiconductor material to alter from one of the high-resistance state and the low-resistance state to another.

14. The method of claim 13, wherein the orientation of the second spin polarization can be altered by the external magnetic field.

15. A method of operating a unipolar spin transistor for detecting a magnetic field, wherein the unipolar spin transistor comprises:

a magnetic semiconductor material having a first region, a second region, and a third region, wherein the first region is adjacent to the second region so as to form a first domain between the first region and the second region, and the second region is adjacent to the third region so as to form a second domain between the second region and the third region;

wherein the first region has a first spin polarization, the second region has a second spin polarization opposite to the first spin polarization, and the third region has a third spin polarization parallel to the first spin polarization;

wherein a minority carrier in the second region is characterized by an energy band having a barrier height; and wherein the ferromagnetic semiconductor material has a resistance related to the barrier height, the method comprising the steps of:
  a. subjecting the second region to a test area;
  b. measuring the resistance of the ferromagnetic semiconductor material; and
  c. determining the presence of an external magnetic field, wherein the presence of an external magnetic field causes the barrier height of the energy band of the minority carrier to change, and wherein the change of the barrier height of the energy band causes the resistance of the ferromagnetic semiconductor material to change from one value to another.

16. The method of claim 15, wherein each of the first region, the second region and the third region comprises a p-type semiconductor layer.

17. The method of claim 15, wherein each of the first region, the second region and the third region comprises an n-type semiconductor layer.

18. A method of operating a unipolar spin transistor in a reprogrammable logic process determined by a combination of input logic signals, wherein the unipolar spin transistor comprises:

a magnetic semiconductor material having a first region, a second region, and a third region, wherein the first region is adjacent to the second region so as to form a first domain between the first region and the second region, and the second region is adjacent to the third region so as to form a second domain between the second region and the third region;

wherein the first region and the third region have a first spin polarization, the second region has a second spin polarization, and each of the first spin polarization and the second spin polarization can be up or down;

wherein the ferromagnetic semiconductor material is in a first non-volatile state when the second spin polarization of the second region is opposite to the first spin polarization of the first and third regions, and the ferromagnetic semiconductor material is in a second non-volatile state when the second spin polarization of the second region is aligned to the first spin polarization of the first and third regions; and wherein each of the first and second non-volatile states represents a binary value, the method comprising the steps of:
  a. subjecting the second region to a magnetic field to cause the state of the ferromagnetic semiconductor material to alter from one of the first and second non-volatile states to another, thereby generating a new binary value relating to a new input logic signal; and
  b. storing the new binary value relating to a new input logic signal so as to reprogram a logic process.

* * * * *